United States Patent [19]

Basch

[11] Patent Number: 4,575,654

[45] Date of Patent: Mar. 11, 1986

[54] PIEZOCERAMIC COUPLER CONTROL CIRCUIT

[75] Inventor: John G. Basch, North Olmsted, Ohio

[73] Assignee: General Electric Company, Schenectady, N.Y.

[21] Appl. No.: 655,807

[22] Filed: Oct. 1, 1984

[51] Int. Cl.[4] .......................................... H01L 41/08
[52] U.S. Cl. .................................................. 310/318
[58] Field of Search .............................. 310/316–318, 310/357, 358; 318/116–118; 363/17, 56, 98, 132–134; 315/219; 323/289

[56] References Cited

U.S. PATENT DOCUMENTS

| | | | |
|---|---|---|---|
| 3,069,626 | 12/1962 | Lungo | 310/318 X |
| 3,518,573 | 6/1970 | Smith | 310/318 X |
| 3,683,210 | 8/1972 | Kawada | 310/318 |
| 3,689,781 | 9/1972 | Kawada | 310/318 |
| 3,743,868 | 7/1973 | Kawada | 310/318 |
| 3,778,648 | 12/1973 | Kawada | 310/318 |
| 4,392,074 | 7/1983 | Kleinschmidt et al. | 310/318 X |
| 4,408,270 | 10/1983 | Anderson et al. | 363/132 |

FOREIGN PATENT DOCUMENTS 0600640 3/1978 U.S.S.R. ............................ 310/318

OTHER PUBLICATIONS

Piezo Ignition Coupler, Siemens Corp., Feb. 15, 1982.
Advanced Piezoproducts Due to Thin Film Technology, by Kleinschmidt, *Siemens Components XV*, Siemens Corp., 1980.
Inductor, Optical or Piezoelectric Control for Potential-Free Drive of SIPMOS Power Transistors, by Pichler, Siemens Corp., *Siemens Components XVII*, 1982.

Primary Examiner—Mark O. Budd
Attorney, Agent, or Firm—N. D. Herkamp; Philip L. Schlamp; Fred Jacob

[57] ABSTRACT

A control circuit for supplying power to a piezoceramic coupler includes a controllable oscillator for supplying an output signal having the resonance frequency of the piezoceramic coupler and an amplitude control circuit to control the amplitude of the output signal of the piezoceramic coupler. Switching devices are also included to control interruption of the application of the drive signal to the piezoceramic coupler.

15 Claims, 2 Drawing Figures

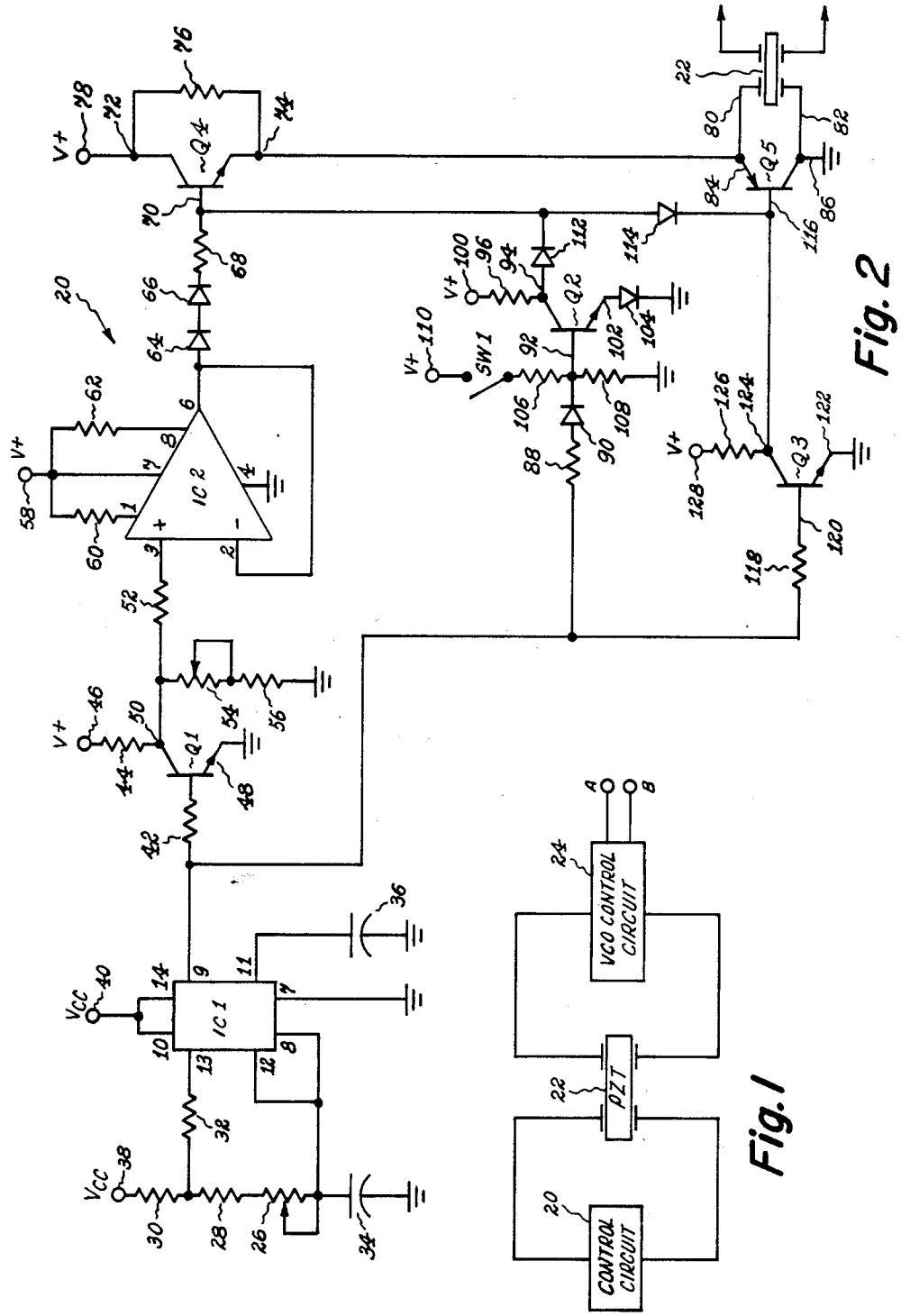

PIEZOCERAMIC COUPLER CONTROL CIRCUIT

BACKGROUND OF THE INVENTION

1. Field of the Invention

The present invention relates to drive circuits for piezoceramic devices, and, more particularly, to a drive circuit for a piezoceramic device capable of providing a controlled variable load current to an output device.

2. Description of the Prior Art

Previous circuits utilizing piezoceramic couplers as isolation between the control and load circuits are intended for triggering electronic power switches. Thus, the piezo device is driven at a fixed frequency and primary voltage to provide pulses for electronic devices. Such prior art methods of switching the primary voltage of a piezoelectric device do not lend themselves to variable load current control which is required for controlling the output of loads such as fluorescent lamps connected to electronic ballasts.

The relative size and cost of a piezoceramic coupler makes the device an attractive replacement for a magnetic isolation transformer. However, a 10 kilohertz control signal normally required for an electronic ballast is not within the bandwidth limitations of most piezoceramic couplers. Therefore, a design is needed for a circuit that can perform functionally as a source of an electronic ballast control signal switched at the coupler's resonance frequency.

SUMMARY OF THE INVENTION

An object of the present invention is to provide a control circuit for supplying a drive signal to a piezoceramic coupler. A more specific object of the present invention is to provide a control circuit for supplying an amplitude modulated d-c drive signal to a piezoceramic device for control of the output from the piezoceramic coupler.

Accordingly, the present invention comprises, briefly and in a preferred embodiment, an oscillator circuit providing a controllable frequency output signal, an operational amplifier circuit for providing a controllable amplitude, amplitude modulated d-c drive signal, and a power transistor for driving the input of the piezoceramic coupler. A second power transistor is provided for assisting in the turn-off of the drive to the coupler during one-half of each cycle of the drive signal. In a particularly preferred embodiment, an override circuit is provided to control interruption of drive power to the load.

BRIEF DESCRIPTION OF THE DRAWINGS

Further objects and advantages of the present invention together with its organization, method of operation, and best mode contemplated may best be understood by reference to the following description taken in conjunction with the accompanying drawings in which:

FIG. 1 is a block diagram showing the use of the present invention in a control arrangement; and FIG. 2 is a circuit diagram illustrating schematically the piezoceramic coupler control circuit of the present invention.

DESCRIPTION OF THE PREFERRED EMBODIMENTS

The circuit in FIG. 1 includes control circuit 20, piezoceramic coupler 22 and voltage controlled oscillator (VCO) control circuit 24. The load circuit may comprise a fluorescent lamp circuit including an electronic ballast as disclosed in U.S. Pat. No. 4,408,270 issued Oct. 4, 1983 to Anderson et al, assigned to the assignee of the present case and incorporated herein by reference, connected to the piezoceramic coupler 22 for controlling the light output level of the fluorescent lamps. The VCO control circuit 24 converts a variable voltage, fixed frequency signal provided as the output signal by the piezoceramic coupler 22 to a fixed voltage, variable frequency output signal at terminals A and B. This output signal may be used to control a load, such as the inverter circuit shown in the above-referenced U.S. Pat. No. 4,408,270.

The control circuit 20 is shown in detail in FIG. 2. An oscillator circuit IC1 provides an output reference signal having a frequency equal to the resonance frequency of the piezoceramic coupler 22. The output frequency of the oscillator IC1 is established by the values of resistors 26, 28, 30 and 32 and of the capacitor 34. The resistor 26 is connected to pins 8 and 12 as shown, and resistor 32 is connected to pin 13 of the oscillator circuit IC1. An input voltage $V_{cc}$ is provided to terminal 38 connected to resistor 30 and to terminal 40 connected to pins 10 and 14 of oscillator circuit IC1. The output at pin 9 toggles between high and low states, at the frequency determined by the values of the resistors and capacitor. The transistors Q2 and Q3 and operational amplifier integrated circuit IC2 are used as current buffers and voltage amplifiers to sink and source the current for driving the power transistors Q4 and Q5. Transistor Q1 is connected via resistor 42 to the output pin 9 of oscillator IC1. The collector of Q1 is connected via resistor 44 to terminal 46 to which a voltage V+ is applied, and the emitter 48 of Q1 is connected to ground. The output from collector 50 of Q1 is connected via resistor 52 to input terminal 3 of operational amplifier integrated circuit IC2. A feedback signal is applied to terminal 2 of operational amplifier IC2 from the output terminal 6 so that IC2 operates in the voltage follower mode. The voltage level applied to the input terminal 3 of operational amplifier IC2 is controlled by the voltage divider network of resistor 44 and the combination of resistors 54 and 56 to control the magnitude of the voltage applied to the input terminal from transistor Q1. Pin 7 of operational amplifier IC2 is connected to a terminal 58 to which a source of voltage of a predetermined level V+ is connected. Terminals 1 and 8 of IC2 are connected via resistors 60 and 62, respectively, to terminal 58. The output from terminal 6 of IC2 is connected via diodes 64 and 66 and resistor 68 to the base terminal 70 of power transistor Q4. Collector 72 of transistor Q4 is connected to a terminal 78 to which the voltage V+ is applied, and emitter terminal 74 is connected to input terminal 80 of the piezoelectric coupler 22. The input terminal 82 of piezoceramic coupler 22 is connected to ground. Resistor 76 is connected across transistor Q4 to assist with eliminating simultaneous conduction between transistors Q4 and Q5 when the input voltage drops below a predetermined level. Emitter terminal 74 is also connected to the emitter terminal 84 of transistor Q5 whose collector terminal 86 is connected to ground. The output waveform from pin 9 of IC1 also is supplied via resistor 88 and diode 90 to the base terminal 92 of transistor Q2. The collector 94 of Q2 is connected via resistor 96 to terminal 100, and emitter terminal 102 is connected via diode 104 to ground. Also connected to the base terminal 92 is the switch circuit including resistors 106 and 108 and switch SW1 connected to terminal 110 to which the positive voltage supply for supplying V+ is attached. Diode 112 is connected to the collector terminal 94 of Q2 and to the base terminal 70 of power transistor Q4 and and is also connected via diode 114 to the base terminal 116 of power transistor Q5. The output from pin 9 of oscillator IC1 is also supplied via resistor 118 to the base terminal 120 of transistor Q3, whose emitter terminal 122 is connected to ground and whose collector terminal 124 is connected via resistor 126 to a terminal 128 to which the positive voltage source is connected.

The circuit shown in FIG. 2 operates as follows: The output frequency of the oscillator IC1 is set by adjustment of the potentiometer 26 to a predetermined value to establish a frequency equivalent to the resonance frequency of the piezoceramic device. The output of the oscillator at pin 9 toggles between high and low states at the frequency set by resistors 26, 28, 30 and 32 and capacitor 34, and this output is supplied to the respective base terminals of transistors Q1, Q2 and Q3. A low output from pin 9 of IC1 turns Q1 off, so that a voltage level determined by the setting of potentiometer 54 and the magnitude of the voltage V+, applied at terminal 46, is applied to input terminal 3 of op-amp IC2. IC2 serves as a current amplifier for driving emitter follower Q4 and providing an amplitude modulated direct current, d-c, output signal to the base terminal 70 of Q4. Direct current as used herein is used in the broad sense of a unidirectional electrical signal not a constant value signal. The amplitude modulated d-c output signal switches from a high voltage level to a low voltage level at the frequency set by reference frequency oscillator circuit. The voltage level applied to the base terminal 70 of power transistor Q4 via output terminal 6 is equal to the voltage input at terminal 3 less the diode drops of diodes 64 and 66 and the resistive drop across resistor 68. This amplitude modulated signal turns on transistor Q4, which applies the amplitude modulated signal to the input terminal 80 of the piezoceramic device. The low output pulse from pin 9 of IC1 is also applied to the base terminal 120 of transistor Q3 which turns transistor Q3 off, so that the base 116 of power transistor Q5 is pulled high, and therefore the transistor Q5 is turned off. This allows transistor Q4 to apply an amplitude modulated pulse to the input of the piezoceramic coupler 22 during each negative half-cycle of IC1. The coupler 22 then provides an output signal to the VCO control circuit 24.

At the end of each negative half-cycle, the output from pin 9 of IC1 is switched high, which provides drive current to the base terminals of transistors Q1, Q2 and Q3. The turn-on of transistor Q1 causes the voltage at 50 to drop and removes the input voltage from the input pin 3 of IC2 driving the output of op-amp IC2 to zero and interrupting drive current to the base 70 of transistor Q4. Switching on transistor Q3 allows a current from terminal 78 via resistor 76 to be applied via emitter 84 to the base 116 of power transistor Q5 turning on transistor Q5 to enable it to sink the energy stored in the piezoceramic coupler during the low voltage period of IC1. When turned on, transistor Q3 also discharges the collector-base junction of transistor Q4 rapidly through diode 114 and the collector 124. This output stage reduces the possibility of simultaneous conduction between the transistors Q4 and Q5.

If switch SW1 is closed, the transistor Q2 is turned on by application of voltage V+ at terminal 110 and reverse biases the diode 112. The current flow through transistor Q4 is then dependent upon the setting of the potentiometer 54, which allows control of the amplitude of the pulse applied to the terminal 80 of the piezoceramic coupler by the user selection of the setting of potentiometer 54 as described above. Thereby, the user can control the amplitude of the signal applied to the VCO control circuit 24 of FIG. 1, and thereby the frequency of the output at terminals A, B. By proper control of potentiometers 26 and 54, the frequency can be selected in the range of 85-110 KHz. If switch SW1 is open, transistor Q2 is switched on and off by the application of the reference frequency pulses from pin 9 of oscillator IC1 in phase with the output of operational amplifier IC2. When this occurs, the base of transistor Q4 switches between the minimum and maximum voltage levels as the transistor Q2 switches on and off. When a negative pulse is applied to base 92, transistor Q2 turns off, and the voltage applied to the base 70 of the power transistor Q4 is raised to the full supply voltage V+ at terminal 100 less the drop across resistor 96 and diode 112 to cause transistor Q4 to apply that voltage to the terminal 80 of the piezoceramic coupler. The voltage level V+ can be selected based upon load circuit parameters such that the voltage applied to terminal 80 by transistor Q4 will turn off a load such as an electronic ballast such as shown in the above-incorporated Pat. No. 4,408,270. In this arrangement, opening switch SW1 turns off the lamp ballast circuit connected as a load to the output of the VCO control circuit, and the combination of switch SW1 and transistor Q2 serves as an override switch for disabling the fluorescent lamp load circuit.

In a particular exemplary construction of the control circuit of the present invention, the component values shown in Table I were employed.

TABLE I

| Resistor | Resistance (K ohms) |
|---|---|
| 26 | 1.0 |
| 28 | 9.8 |
| 30 | 10.0 |
| 32 | 2.4 |
| 42 | 7.7 |
| 44 | 1.6 |
| 52 | 10.0 |
| 54 | 1.0 |
| 56 | 0.23 |
| 60 | 0.5 |
| 62 | 0.5 |
| 68 | 1.0 |
| 76 | 5.0 |
| 88 | 6.5 |
| 96 | 2.0 |
| 106 | 14.0 |
| 108 | 10.0 |
| 118 | 6.5 |
| 126 | 10.0 |
| Capacitor | capacitance |
| 34 | 330 pF |
| 36 | 0.01 μF |
| Integrated Circuits | |
| IC1 | 556 Timer |
| IC2 | LM 110H Op Amp |
| Piezoceramic Coupler | V42314-D8-A Siemens |
| $V_{cc}$ | 3.0-18 volts |
| V+ | 4-18 volts |

The value of trimpot 26 was set so that the reference frequency was set at 90 kilohertz, the resonance frequency of the piezoceramic coupler. The voltage level of the amplitude modulated signal output by the op-amp IC2 was set by the dimmer pot 54 to provide a voltage swing of 0–3.5 volts RMS across the primary 80, 82 of the piezoceramic coupler 22 via emitter follower Q4. With switch SW1 closed, the voltage level of the amplitude modulated signal provided to the piezoceramic coupler could be controlled to provide dimming of the fluorescent lamp load between about 25% and 100% of full intensity in an approximately linear relationship. When switch SW1 was opened, the lamp ballast circuit was turned off. The circuit also provides high voltage isolation which is required for fluorescent lamp ballasts. The component values are exemplary only and can be selected to be other values required to provide the necessary output signal from the piezoceramic coupler to drive a particular VCO control circuit selected for use with a particular load.

As will be appreciated by those skilled in the art, the present invention provides a readily controllable drive circuit for a piezoceramic coupling circuit to allow control of the output of the piezoceramic coupler to be matched to a load circuit.

What I claim as new and desire to secure by Letters Patent of the United States is:

1. A control circuit for a piezoceramic coupler comprising:
    controllable drive circuit means for applying an amplitude modulated d-c drive signal to a pair of input terminals of said piezoceramic coupler comprising:
    reference frequency oscillator circuit means for providing at an output terminal thereof a switching control signal having a predetermined frequency;
    operational amplifier means for receiving as one input said switching control signal from said reference frequency oscillator circuit means and providing at an output terminal thereof an amplitude modulated d-c signal; and
    first power transistor means for receiving said amplitude modulated d-c signal from said operational amplifier means and transmitting said amplitude modulated d-c signal as a drive signal to said piezoceramic coupler; and
    input discharge means for controllably removing said drive signal from said input terminals of said piezoceramic coupler.

2. The invention of claim 1 wherein said reference frequency oscillator circuit means comprises:
    high frequency oscillator integrated circuit means for generating said switching control signal; and
    first potentiometer means connected to said high frequency oscillator integrated circuit means for selecting the frequency of the output signal of said oscillator circuit means.

3. The invention of claim 2 wherein said operational amplifier means further comprises:
    integrated circuit operational amplifier means for converting said switching control signal into said amplitude modulated d-c output signal; and
    second potentiometer means connected to one input of said integrated circuit operational amplifier means for selectively controlling the amplitude of said amplitude modulated d-c output signal.

4. The invention of claim 3 further comprising:
    a constant voltage power supply means; and
    wherein said first power transistor means comprises an emitter follower power transistor having a collector terminal connected to said constant voltage power supply means, a base terminal connected to said output terminal of said operational amplifier means and an emitter terminal connected to one input terminal of said pair of input terminals of said piezoceramic coupler.

5. The invention of claim 4 further comprising:
    first switching transistor means for receiving said switching control signal and selectively applying an input signal to said operational amplifier means.

6. The invention of claim 5 wherein said first switching transistor means further comprises:
    a base terminal connected to said output terminal of said reference frequency oscillator means;
    an emitter terminal connected to electrical ground; and
    a collector terminal connected to said constant voltage power supply means and to said one input of said integrated circuit operational amplifier means for preventing the application of an input signal to said one input of said integrated circuit operational amplifier means during the high voltage half-cycle of said switching control signal and enabling the application of an input signal to said one input of said integrated circuit operational amplifier means during the low voltage half-cycle of said switching control signal.

7. The invention of claim 4 wherein said input discharge means comprises:
    second power transistor means for controllably removing stored electrical energy from said piezoceramic coupler.

8. The invention of claim 7 wherein said input discharge means further comprises:
    second power transistor means comprising an emitter connected to the emitter of said first power transistor means and to said one input terminal of said piezoceramic coupler, a collector connected to a second input terminal of said piezoceramic coupler and to electrical ground, and a base;
    first diode means for connecting said base terminal of said first power transistor means to said base of said second power transistor means; and
    second switching transistor means having a base terminal connected to said output terminal of said reference frequency oscillator circuit means and having a collector terminal connected to said constant voltage power supply means and to said base terminal of said second power transistor means for turning on said second power transistor means during the high voltage half-cycle of said switching control signal to remove electrical energy from said piezoceramic coupler and to allow current flow through said first diode means to remove electrical charge from the collector-base junction of said first power transistor means during said high voltage half-cycle of said switching control signal.

9. The invention of claim 8 wherein said operational amplifier integrated circuit means further comprises:
    feedback connection means connected between the output of said operational amplifier integrated circuit means and a second input thereof whereby said operational amplifier means operates in a voltage follower mode.

10. The invention of claim 4 further comprising:
    output override circuit means for selectively supplying a control signal to said piezoceramic coupler to selectively override said amplitude modulated d-c output signal.

11. The invention of claim 10 wherein said output override circuit means comprises:

third switching transistor means having a collector connected to said base terminal of said first power transistor means and said constant voltage power supply means; an emitter connected to electrical ground; and a base terminal connected to said output terminal of said reference frequency oscillator circuit means; and control switch means connected to said constant voltage power supply means and said base terminal of said third switching transistor means for controlling the on-off state of said third switching transistor means such that when said control switch means is closed said third switching transistor means is saturated and no signal from said third switching transistor is output to said base terminal of said first power transistor means, and when said control switch means is open said third switching transistor means is switched in phase with said amplitude modulated d-c signal from said operational amplifier to provide an override output signal to said base terminal of said first power transistor means during the low voltage half-cycle of said switching control signal.

12. The invention of claim 11 wherein said output override circuit means further comprises:

second diode means connected to said collector terminal of said third switching transistor means and said base terminal of said first power transistor means to prevent electrical current flow from said operational amplifier means to said collector terminal of said third switching transistor means when said third switching transistor means is turned on.

13. The invention of claim 4 wherein:

said frequency of said output signal of said reference frequency oscillator circuit means is selected to be approximately equal to the resonance frequency of said piezoceramic coupler.

14. The invention of claim 13 wherein:

said frequency is in the range of approximately 85 kilohertz to about 110 kilohertz.

15. The invention of claim 14 wherein:

said frequency is approximately 90 kilohertz.

* * * * *